(12) United States Patent
Kato et al.

(10) Patent No.: US 7,075,871 B2
(45) Date of Patent: Jul. 11, 2006

(54) METHOD AND DEVICE FOR RECORDING OPTICAL DATA

(75) Inventors: Masaki Kato, Kanagawa (JP); Shinya Narumi, Kanagawa (JP); Katsuyuki Yamada, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 560 days.

(21) Appl. No.: 10/397,820

(22) Filed: Mar. 26, 2003

(65) Prior Publication Data
US 2003/0214888 A1 Nov. 20, 2003

(30) Foreign Application Priority Data
Mar. 27, 2002 (JP) .............................. 2002-089145

(51) Int. Cl.
G11B 7/00 (2006.01)
(52) U.S. Cl. ................................ 369/47.53; 369/59.11
(58) Field of Classification Search ............. 369/47.53, 369/59.11, 47.28
See application file for complete search history.

(56) References Cited

U.S. PATENT DOCUMENTS

| | | | |
|---|---|---|---|
| 5,629,913 A | 5/1997 | Kaku et al. | |
| 5,642,343 A | 6/1997 | Toda et al. | |
| 5,732,062 A | 3/1998 | Yokoi et al. | |
| 5,736,657 A | 4/1998 | Ide et al. | |
| 5,974,025 A | 10/1999 | Yamada et al. | |
| 6,280,684 B1 | 8/2001 | Yamada et al. | |
| 6,280,810 B1 | 8/2001 | Nakamura et al. | |
| 6,319,368 B1 | 11/2001 | Ide et al. | |
| 6,373,802 B1 | 4/2002 | Hattori et al. | |
| 6,388,978 B1 | 5/2002 | Ogawa et al. | |
| 6,411,579 B1 * | 6/2002 | Nobukuni et al. | 369/59.12 |
| 6,445,669 B1 | 9/2002 | Hattori et al. | |
| 6,503,592 B1 | 1/2003 | Yamada et al. | |
| 2001/0017833 A1 | 8/2001 | Yamada et al. | |
| 2002/0021594 A1 | 2/2002 | Nakamura et al. | |
| 2002/0034663 A1 | 3/2002 | Ide et al. | |
| 2002/0075789 A1 | 6/2002 | Katoh et al. | |
| 2002/0093897 A1 | 7/2002 | Hattori et al. | |
| 2002/0110063 A1 | 8/2002 | Yamada et al. | |
| 2002/0145963 A1 | 10/2002 | Narumi et al. | |
| 2002/0155248 A1 | 10/2002 | Ito et al. | |
| 2003/0008236 A1 | 1/2003 | Yamada et al. | |

(Continued)

FOREIGN PATENT DOCUMENTS

EP 0 477 892 A 4/1992

(Continued)

OTHER PUBLICATIONS

U.S. Appl. No. 09/569,501, filed May 11, 2000.

(Continued)

*Primary Examiner*—Nabil Hindi
*Assistant Examiner*—Crystal Jones
(74) *Attorney, Agent, or Firm*—Cooper & Dunham LLP (57) ABSTRACT

There is provided a method and a device for recording optical data able to improve recording power setting during recording by means of PWM with a small number of pulses. During the test recording, using a period of a recording channel clock Tw as the minimum unit, marks having different mark lengths of $n1 \cdot Tw$ and $n2 \cdot Tw$ ($n1 < n2$) are recorded with the same number of m ($m < n$) light emitting pulses, while successively changing the maximum power Pw of the recording signals. The recorded marks are reproduced and the mark lengths T1 and T2 are measured from the reproduced signals. The recording power can be set by evaluating the deviations $D1 = T1 - n1 \cdot Tw$ and $D2 = T2 - n2 \cdot Tw$.

8 Claims, 10 Drawing Sheets

U.S. PATENT DOCUMENTS

| | | |
|---|---|---|
| 2003/0026195 A1 | 2/2003 | Kato et al. |
| 2003/0043712 A1 | 3/2003 | Nakamura et al. |
| 2003/0044719 A1 | 3/2003 | Katoh et al. |

FOREIGN PATENT DOCUMENTS

| | | |
|---|---|---|
| EP | 0 932 144 A2 | 7/1999 |
| JP | 9-134525 A | 5/1997 |
| JP | 9-219021 A | 8/1997 |
| JP | 2001-331936 A | 11/2001 |

OTHER PUBLICATIONS

U.S. Appl. No. 09/793,131, filed Feb. 27, 2001.

* cited by examiner

METHOD AND DEVICE FOR RECORDING OPTICAL DATA

BACKGROUND OF THE INVENTION

1. Field of the Invention

The present invention relates to a device and a method for recording optical data to phase-change recording media such as CD-RW, DVD-RAM, DVD-RW, DVD+DW and others.

2. Description of the Related Art

High-speed optical recording media have recently been and continue to be in high demand. Particularly, efforts are being made in increasing the speed of disk-shaped optical recording media, because speed of recording and reproduction of such kind of optical disks can be increased by raising their rotational speed. Among the optical disks, those using optical recording media have simple recording mechanisms because they are capable of recording by only modulating the intensity of the irradiating light, hence it is possible to lower the prices of these media and recording devices. On the other hand, in such kind of devices, since reproduction is achieved also by modulating the intensity of the irradiating light, high compatibility with read-only devices is ensured. As a result of the above facts, optical disks are widely used, and along with the increasing capacity of electronic information, higher density and higher speed optical disks are further required.

Among the optical disks recordable by light-intensity modulation, those using phase-change materials are prevailing because they are rewritable for many times. In an optical disk using a phase-change material, in order to record data, a rapid cooling state and a slow cooling state of the recording material are generated by modulating the intensity of the irradiating light. The recording material is in amorphous state under the rapid cooling condition, and is in a crystalline state under the slow cooling condition. The distinct optical properties of the amorphous state and the crystalline state enable optical information to be recorded.

The principle of recording involves sophisticated mechanisms of rapid cooling and slow cooling of the recording material. As disclosed in the Japanese Unexamined Patent Application Publication (Kokai) No.9-219021, high speed recording is achieved by irradiating a light beam to the recording material with the intensity of the light modulated into three values obtained by pulse division.

When the recording speed becomes higher, however, frequency of the recording channel clock also rises, for example, the frequency of the recording channel clock becomes 104 MHz for 24 times speed CD-RW, and becomes 131 MHz for 5 times speed DVD-RW and DVD+RW. Therefore, in the recording strategy of the related art, the rising times and falling times of the light emitting pulses lengthen, and the effective irradiating energy decreases.

Figure 1:
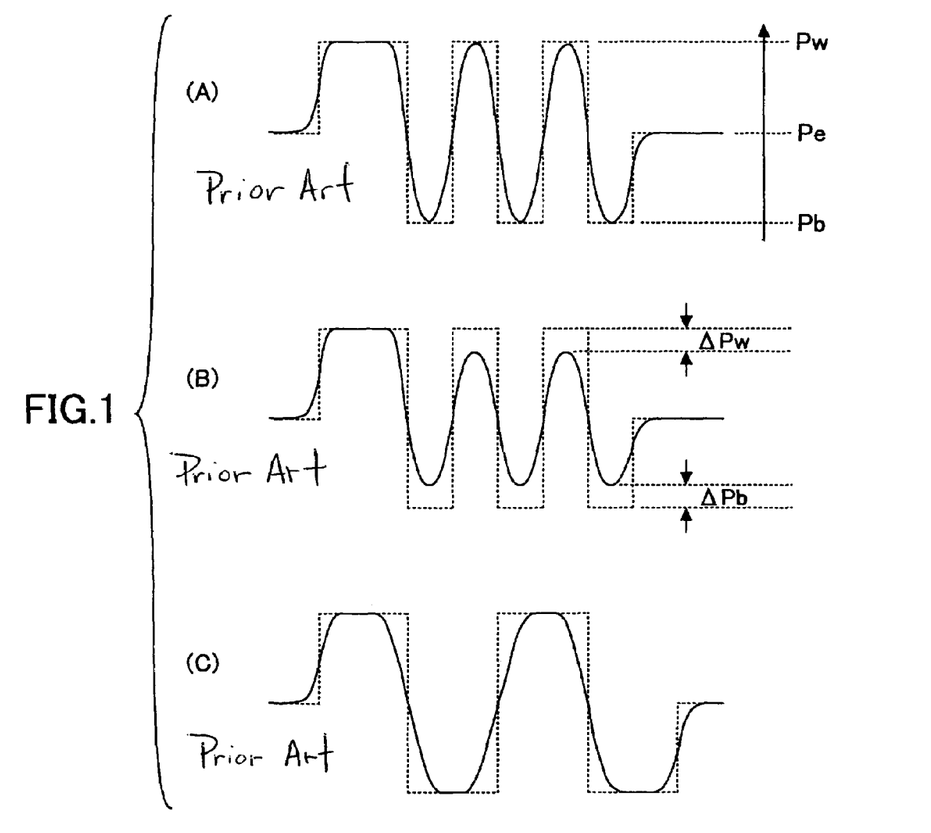
FIG. 1A shows actual pulse shapes of light emitting pulses deviating from rectangular shapes.
FIG. 1B is a view showing that the recording power (peak value) Pw lowers by ΔPw, and the bias power (bottom value) Pb rises by ΔPb at higher frequencies of the recording channel clock.
FIG. 1C shows a technique of recording using two pulses.

FIGS. 1A through 1C present an example. As shown in FIG. 1A, contrary to the ideal shape of light emitting pulses represented by the dotted line, each actual light emitting pulse requires a rising time and a falling time as indicated by the solid line, and thereby cannot be of a rectangular shape. Further, when frequency of the recording channel clock becomes higher, as shown in FIG. 1B, the rising times and the falling times become longer, and sufficiently high recording power (peak value) and sufficiently low bias power (bottom value) cannot be secured. In other words, the recording power (peak value) Pw decreases by $\Delta Pw$, and the bias power (bottom value) Pb increases by $\Delta Pb$.

Recording with pulses of such a pulse shape, the recording material cannot be heated and cooled sufficiently, and it is difficult to secure a slow cooling state. Consequently, the recording mark (just abbreviated as "mark" hereinafter) in an amorphous state cannot be formed sufficiently, and the amplitudes of the reproduced signals become low.

This difficulty can be overcome if utilizing a light emitting source of short rising and falling times (a laser diode and a driving device thereof), but it is not easy to guarantee a light emitting source working even at frequencies over 100 MHz.

In the related art, to solve the problem, it is proposed to reduce the number of the recording pulses by methods disclosed in Japanese Unexamined Patent Publication No. 9-134525 and in U.S. Pat. No. 5,732,062.

In detail, FIG. 1B shows the method of recording using three pulses, whereas FIG. 1C shows the recording technique using two pulses. Due to this technique, it is possible to obtain a long light emission time per pulse (duration of the level of Pw) and a long cooling time (duration of the level of Pb), and to reduce the influence of the rising time and the falling time mentioned above.

In this method, however, in order for light emission with a number of m pulses, different optimum light emission patterns have to be set for marks of different lengths. This optimization is difficult, and this method has not been made into practical use.

Japanese Unexamined Patent Publication No. 2001-331936 discloses a method of setting pulse lengths independently and separately. Using this method, high modulations and good jitter characteristics are obtainable even in optical systems having a low recording power and a low responding performance.

As shown above, however, since complicated adjustments are necessary for marks of various lengths, the dependence of the length of the recording mark (just abbreviated as mark length hereinafter) on the recording power is different for different kinds of marks. Consequently, the margin of the recording power is narrow, and the accuracy of the method of setting the optimum recording power (OPC: Optimum Power Control) becomes essential.

In recording methods of the related art, usually the method disclosed in Japanese Unexamined Patent Publication No. 9-138947 is used for setting the recording power, and is thought to be reliable. In the method of reducing the pulse number, the recording power has to be set according to time information associated with mark lengths, because the time information turns out to change more remarkably than the modulation that is a characteristic value of the amplitudes of the reproduced signals.

SUMMARY OF THE INVENTION

Accordingly, it is a general object of the present invention to solve the above problems of the related art.

A more specific object of the present invention is to provide a device and a method for recording optical data able to improve recording power setting during recording by intensity modulation with a small number of pulses.

To attain the above object, according to a first aspect of the present invention, there is provided a method for recording optical data to a recording medium by modulating the intensity of an irradiating light beam and by modulating the lengths of a plurality of recording marks and spaces between each two said recording marks, comprising the steps of forming first recording marks each having a length of $n1 \cdot Tw$ and second recording marks each having a length of $n2 \cdot Tw$ using a plurality of m recording pulses each having a predetermined maximum power Pw, while successively changing the maximum power Pw of the recording pulses for testing, reproducing the first and second marks recorded for said testing and measuring lengths T1(Pw) and T2(Pw), respectively, of the recording marks, and setting a recording power Pwo by evaluating deviations D1(Pw) and D2(Pw) of the measured lengths T1(Pw) and T2(Pw) from n1·Tw and n2·Tw, respectively, where Tw is a period of a recording channel clock;
n1, n2 are integers, and n1<n2;
m is an integer, and m<n1;
D1(Pw)=T1(Pw)−n1·Tw; and
D2(Pw)=T2(Pw)−n2·Tw.

According to the above invention, the optimal recording power Pwo is evaluated and set by recording test marks. In this test recording, using the period Tw of a recording channel clock as the minimum unit, recording marks having different mark lengths of n1·Tw and n2·Tw are recorded respectively both with the same number of m light emitting pulses, while the maximum power Pw of the recording signals is successively changed. The recorded marks are reproduced and the actual mark lengths T1 and T2 are measured from the reproduced signals. The recording power Pwo can be set by evaluating the deviations D1 and D2.

As a result, when recording with a small number of pulses, the difference of the dependence of the mark length on the recording power is able to be suppressed to minimum.

In the above method, preferably, the recording power Pwo is set as a value of Pw making the deviation D1(Pw) equal to the deviation D2(Pw).

According to the above invention, the recording power is set to reduce the deviation between the actual mark lengths and their theoretical lengths to minimum, so setting of the recording power can be optimized even by recording using a small number of pulses.

Alternatively, the recording power Pwo is preferably set as a value of Pw making a normalized parameter g(Pw) equal to a constant gα, where g(Pw)=[D2(Pw)−D1(Pw)]/Tw, gα is a characteristic value of a medium, and 0<gα≦0.1.

Alternatively, the recording power Pwo is set as a product of a parameter ρ and a value of the maximum power Pwt making a normalized parameter g(Pw) equal to a constant gβ, where g(Pw)=(D2(Pw)−D1(Pw))/Tw, gβ is a constant, and 0.4≦gβ≦0.6, ρ is in a range from 1.0 to 1.2.

According to the above inventions, methods are provided for effectively setting the recording power even when the condition that D1=D2 is be satisfied.

To attain the above object, according to a second aspect of the present invention, there is provided a device for recording optical data to a recording medium by modulating the intensity of an irradiating light beam and by modulating the lengths of a plurality of recording marks and spaces between two said recording marks, comprising an optical pickup unit for forming the recording marks according to a plurality of recording pulses and for reproducing the recorded marks, a power control unit for controlling a power level of the recording pulses, a mark length measuring unit for measuring the lengths of the recorded marks from the reproduced signals given by the optical pickup unit, and a calculation unit, wherein the optical pickup unit forms first recording marks for testing each having a length of n1·Tw and second recording marks each having a length of n2·Tw using m recording pulses each having a predetermined maximum power Pw, while the power controlling unit successively changes the maximum power Pw of the recording pulses the optical pickup unit reproduces the first and the second marks recorded for said testing, the mark length measuring unit measures lengths T1(Pw) and T2(Pw) of the first and second recorded marks, respectively, and the calculation unit evaluates deviations D1(Pw) and D2(Pw) of the measured lengths T1(Pw) and T2(Pw) from n1·Tw and n2·Tw, respectively, and sets a recording power Pwo, where Tw is a period of a recording channel clock;
n1, n2 are integers, and n1<n2;
m is an integer, and m<n1;
D1(Pw)=T1(Pw)−n1·Tw; and
D2(Pw)=T2(Pw)−n2·Tw.

Preferably, the calculation unit calculates a normalized parameter g(Pw), where g(Pw)=[D2(Pw)−D1(Pw)]/Tw.

These and other objects, features, and advantages of the present invention will become more apparent from the following detailed description of preferred embodiments given with reference to the accompanying drawings.

BRIEF DESCRIPTION OF THE DRAWINGS

FIGS. 1A, 1B and 1C are views of a recording method in the related art, showing the increment of the influence of the rising time and falling time of each light emitting pulse and decrement of effective irradiating energy, where

FIGS. 3A through 3E are views showing examples of light emitting patterns when forming marks, where

FIGS. 6A through 6C are views showing dependence on the recording power of quantities used for setting the recording power, where FIG. 6A shows dependence of modulation on the recording power, FIG. 6B shows dependence of D(Pw) on the recording power in the case of recording using a number of m=(n−1) light emitting pulses, FIG. 6C shows dependence of D1(Pw) and D2(Pw) on the recording power;

DESCRIPTION OF THE PREFERRED EMBODIMENTS

Below, preferred embodiments of the present invention will be explained with reference to the accompanying drawings.

The present invention relates to a method of setting the recording power and a device using this method, when recording optical data by modulating the intensity of an irradiating light beam and using a smaller number of pulses than the related art. The target recording media cover rewritable phase-change optical data recording media, such as CD-RW, DVD-RAM, DVD-RW, DVD+DW, and so on.

Figure 2:
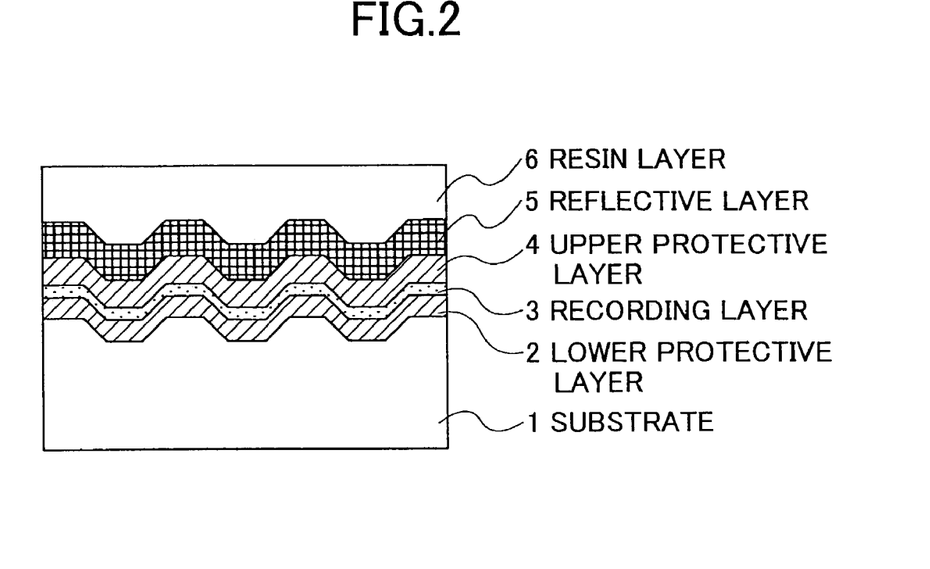
FIG. 2 is a view showing an example of a configuration of a phase-change optical data recording medium.

FIG. 2 shows an example of a configuration of a phase-change optical data recording medium. In this example, the recording medium comprises at least a recording layer 3 and a reflective layer 5 on a substrate 1 which is nearly transparent in the recording and reproducing wavelength region concerned.

Glass and resin can be used as the material of the transparent substrate 1 if considering only mechanical strength of optical discs and transparency, but if cost is also taken into consideration, it is preferable to use polycarbonate resin. In addition, guide grooves can be formed on the substrate 1 to facilitate scanning of a light beam.

Phase-change materials are used to constitute the recording layer 3. A phase-change material has at least two phases reversible between each other, for example, it transits from a crystalline phase to an amorphous phase and vice versa. Data are recorded to a phase-change material by forming amorphous marks on the material in a crystalline state, or by forming crystalline marks on the material in an amorphous state.

The reflective layer 5 can be made from metals or their alloys. For example, Au, Ag, Cu, Al and their alloys may be used.

Generally, protective layers are formed above and below the recording layer 3. As shown in FIG. 2, the protective layers include a lower protective layer 2 for protecting the resin substrate 1 from being heated by the recording layer 3, and an upper protective layer 4 for protecting thermal diffusion of atoms in the recording layer 3 to the reflective layer 5 and for effectively heating the recording layer 3. The lower protective layer 2 may also be a stacked multi-layer film of a plurality of films each having specific thermal or optical characteristics formed between the substrate 1 and the recording layer 3. Similar to the lower protective layer 2, the upper protective layer 4 may also be a stacked multi-layer film of a plurality of films each having specific thermal, optical or chemical characteristics formed between the recording layer 3 and the reflective layer 5.

The protective layers 2 and 4 can be made from dielectric, semiconductor, semi-metal, or mixtures of these materials.

Above the reflective layer 5, a resin layer 6 (overcoat layer) can be formed to protect against mechanical and chemical damage to the layers mentioned above, or a resin substrate may be bonded on the reflective layer 5.

Data are recorded to or reproduced from the optical recording medium by scanning a light beam irradiating to the recording medium and condensed near the recording layer 5. Specifically, recording is made by irradiating a light beam with its intensity modulated to form amorphous marks on the crystalline recording material 3.

In the method for recording optical data related to the present invention, PWM (Pulse Width Modulation) is used to record data by changing the lengths of marks and lengths of spaces between marks with the period of the recording channel clock-Tw as the minimum unit. Examples of PWM may include EFM (Eight to Fourteen Modulation) employed in compact disks, EFM+ (one kind of Eight to Fourteen Modulation) in DVD (Digital Versatile Disk), one to seven modulation in Blue Ray Disk, and so on.

In PWM, because data are encoded into the lengths of marks and spaces, it is essential to make the mark lengths and space lengths uniform. Mark lengths and space lengths are n·Tw (n is an integer), that is, n-fold as long as the period of the recording channel clock Tw. In the case of EFM of double speed compact disk, Tw=231.4 ns, n=3~11, and in the case of double speed DVD, Tw=38.1 ns, n=3~11, 14.

These marks having a length of n·Tw are formed by irradiating a light beam with modulated intensity to the recording layer 3. The irradiating intensity has three levels, and the recording power (denoted as Pw), the erasing power (denoted as Pe), and the bias power (denoted as Pb) satisfy the relation: Pw>Pe>Pb.

When recording marks, a light beam is emitted in a pulsed manner with a peak power Pw (the recording power), and a bottom power Pb (the bias power). When recording spaces (or erasing marks), a light beam having the erasing power Pe is emitted continuously, being the so-called CW (Continuous Wave) light emission (emission of light having a constant intensity without intensity modulation).

Irradiation of a pulsed light beam heats and rapidly cools the recording material in the recording layer 3, thereby amorphous marks are formed. The CW light emission having a lower power heats and gradually cools the recording layer 3, thereby returning the amorphous marks to crystalline state.

FIGS. 3A through 3E show examples of light emitting patterns when forming marks.

A number of m pulses each having a recording power Pw are used to record marks having a length of n·Tw. Here, m is an integer, and m<n. Note that a pulse having a recording power Pw must be followed by a pulse having a bias power Pb.

Figure 3:
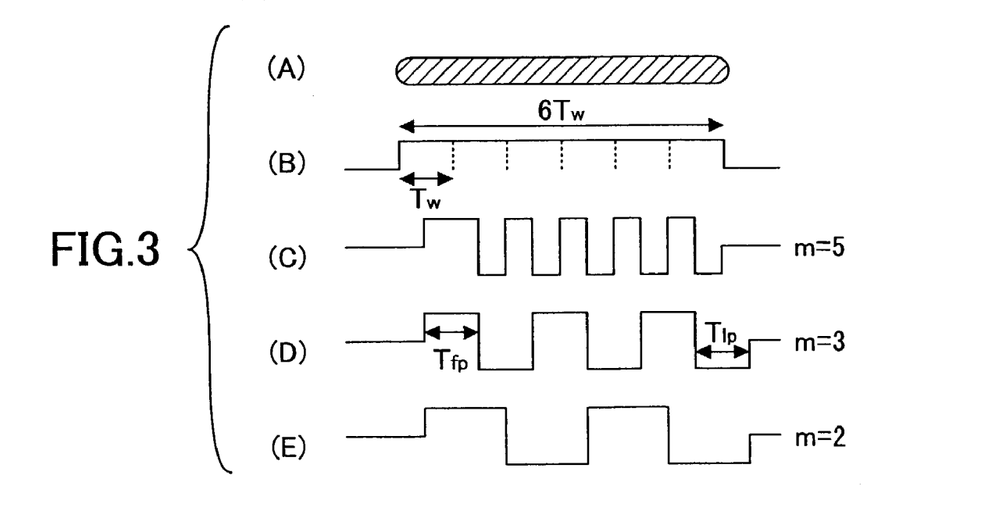
FIG. 3A shows a 6Tw-long recording mark.
FIG. 3B shows a 6Tw-long clock period.
FIG. 3C shows formation of a 6Tw-long recording mark using five pulses.
FIG. 3D shows formation of a 6Tw-long recording mark using three pulses.
FIG. 3E shows formation of a 6Tw-long recording mark using two pulses.

In FIGS. 3A through 3E, n=6. FIG. 3A shows a recording mark having a length of 6Tw, and FIG. 3B shows a clock period having a length of 6Tw.

FIG. 3C shows formation of a recording mark having a length of 6Tw by using five pulses (m=5). It is common to use a number of m=(n−1) pulses to form marks having a length of n·Tw, as used in CD-RW, DVD-RW, and DVD+RW. With this pattern, when n increases by one, m increases by one, too, that is, n and m have simple linear relation, so it is easy to control the mark length.

Similar to FIG. 3C, FIG. 3D shows the case of m=3, and FIG. 3E shows the case of m=2. When the difference between m and n becomes large, it is clear that the pulse width (that is, the sum of the duration of power Pw and the duration of power Pb) becomes large. In other words, as shown in FIG. 3D and FIG. 3E, when the difference between m and n becomes large, marks can be formed by sufficiently heating the recording layer 3 even using a light source having a long rising time and a long falling time (low responding performance). Consequently, it is possible to obtain reproduced signals of high amplitudes even at lower recording power.

Figure 5:
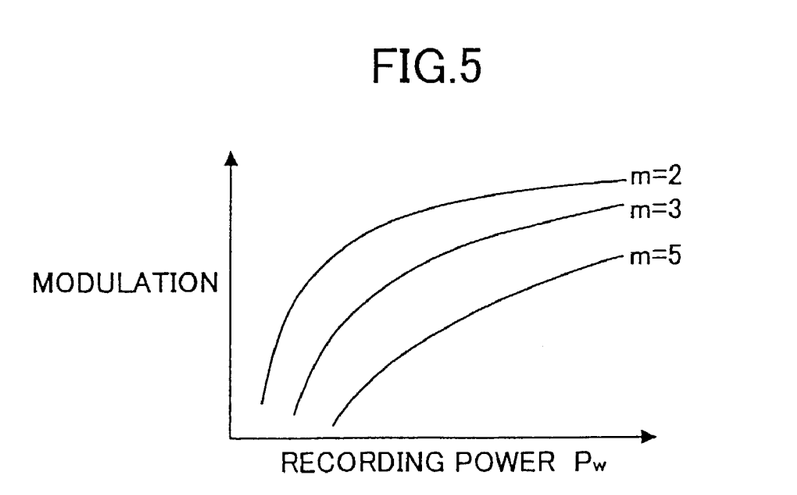
FIG. 5 is a view for schematically showing dependence on the recording power of modulation that represents amplitudes of the reproduced signals when recording using the light emitting pulses shown in FIGS. 3C through 3E.

FIG. 5 schematically shows dependence on the recording power of the modulation that represents amplitudes of the reproduced signals when recording data using light emitting pulses shown in FIGS. 3C, 3D, and 3E. As shown in FIG. 5, the modulation rises with an increasing recording power Pw, so it is possible to enhance S/N of the reproduced signals.

In addition, the modulation decreases with an increasing pulse number m, so with smaller m, better reproduced signals are obtainable even at lower recording power.

Nevertheless, if m becomes smaller, the light emission time in one pulse becomes longer, and m does not simply increase with n, therefore it becomes necessary to record marks having different lengths n1·Tw and n2·Tw (assume n1<n2) using the same number m of pulses.

Figure 4:
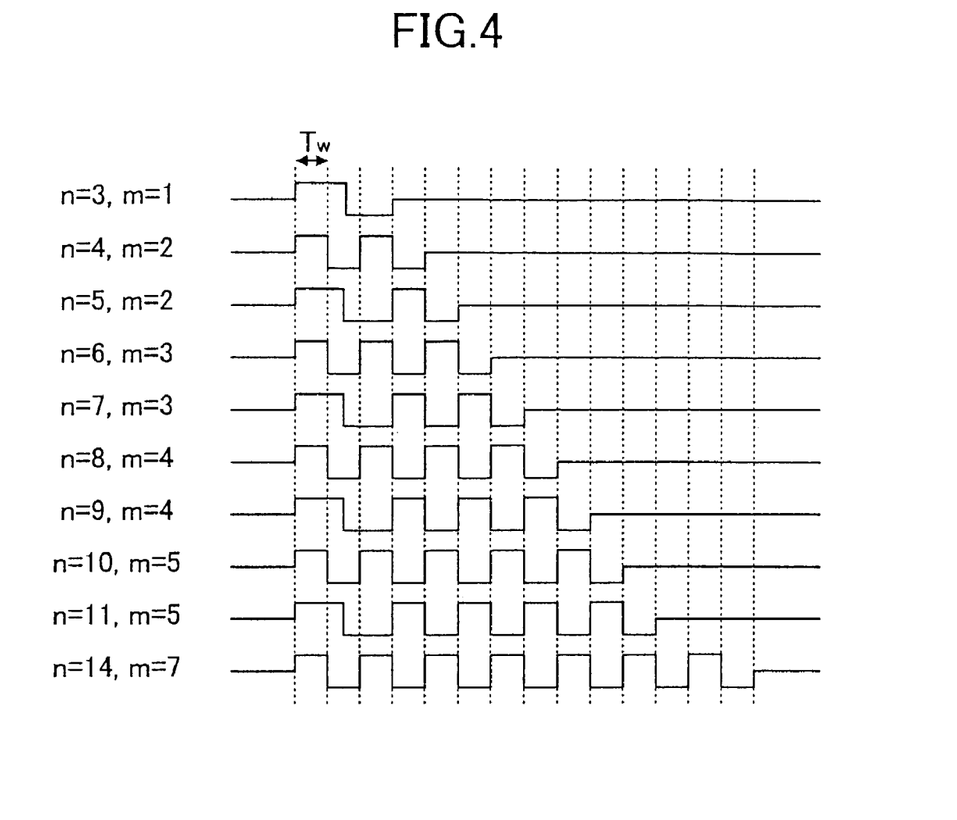
FIG. 4 is a view showing an example of forming marks of different lengths using the same number (m) of pulses.

FIG. 4 shows such kind of recording pulses.

In FIG. 4, parameter n has ten values (n=3~11, 14) and m, the number of pulses, has seven values (m=1~7). The relation between m and n is described as below.

When n is even, m=n/2,

When n is odd, m=(n−1)/2,

Accordingly, when n=4 or n=5, m=2, and when n=6 or n=7, m=3.

That is, examples shown in FIG. 4 are equivalent to the case in which n1 is an even number and n2 is an odd number equal to n1+1.

So, when forming marks having different lengths using the same number of light emitting pulses, the mark length actually formed differs from the theoretical one (the desired mark length). In other words, even if a light beam that theoretically forms marks having a length of n·Tw is irradiated to a medium, when the marks are reproduced by a recording and reproducing device, they are seen as marks having a length of n·Tw+D, and a deviation D takes place.

In the PWM scheme, since information is included into mark lengths, smaller deviations D indicate that the actual mark length is closer to the theoretical one, and the marks are good marks. On the other hand, if D is large, the mark length cannot be identified correctly, and errors occur.

Usually it is necessary to make D less than one-fourth, preferably, one-tenth of the period of the recording channel clock Tw. In the standards of the compact disk (CD), such a deviation (D) is defined and is specified to be less than 40 ns.

Figure 6:
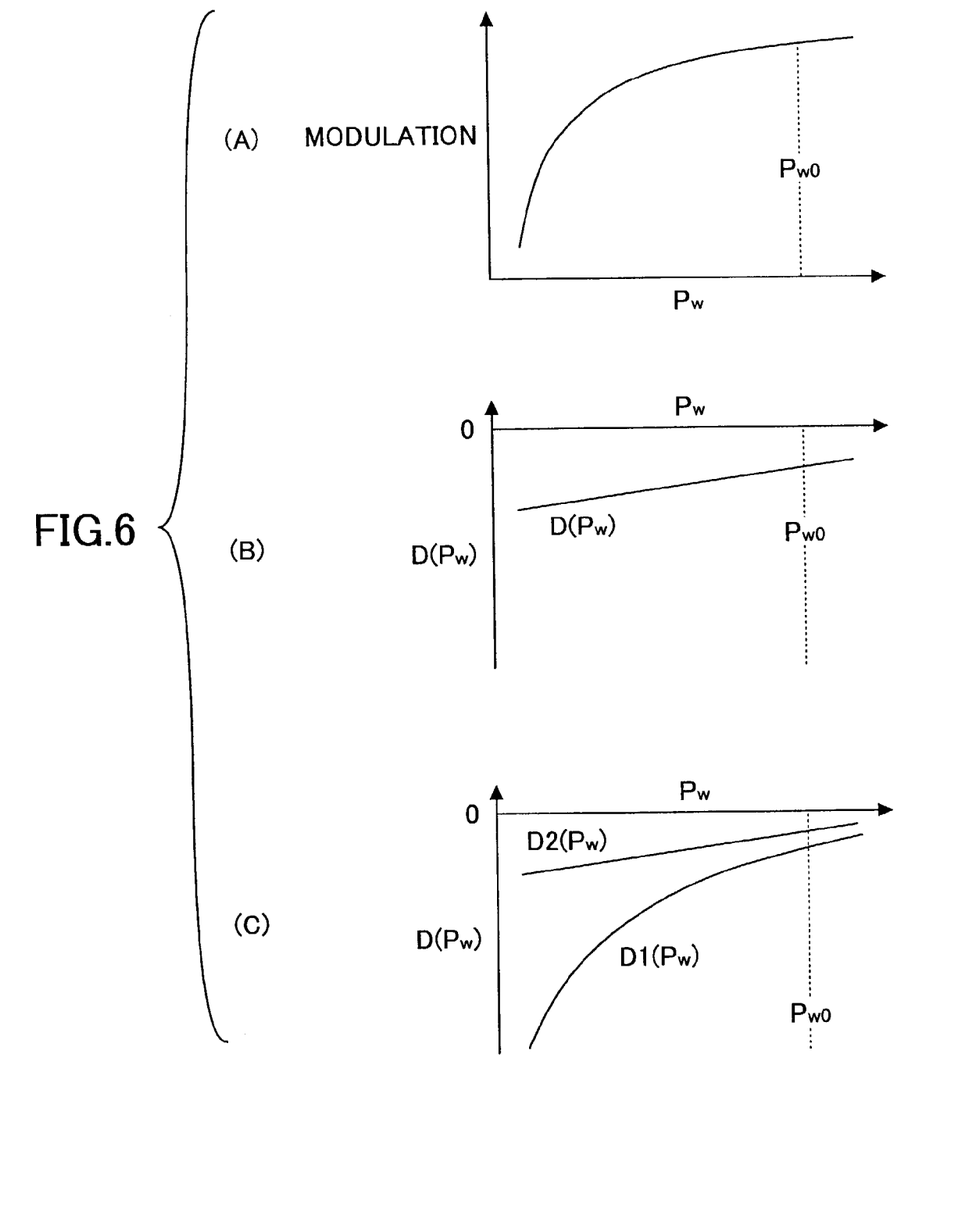

Although D depends on the recording power Pw, this dependence is largely influenced by the pattern of the light emitting pulses. FIG. 6B shows the dependence of D on the recording power in the case of recording by light emission of a number of m=(n−1) pulses, as done in CD-RW, DVD-RW, and DVD+RW in the related art. It is found from this figure, the deviation D varies and approaches zero along with increment of the recording power Pw. In principle, D should be within an allowed range around the specified recording power Pwo. According to standards of the compact disk (CD), D should be less than 40 ns.

In the present invention, however, the same number (m) of pulses are used for recording marks associated with different n (that is, n1 and n2). When recording using such kind of pulsed light emission, the dependence on the recording power Pw of the deviation (D) related with n1 and deviation related with n2 differ from each other. This can be ascribed to the fact that marks having different lengths are recorded using the same number of pulses for each.

FIG. 6C shows dependence of D1(Pw) and D2(Pw) on the recording power Pw, where D1(Pw) represents the deviation of the measured mark length T1 from the theoretical length n1·Tw, and D2(Pw) represents the deviation of the measured mark length T2 from the theoretical length n2·Tw.

It is found from FIG. 6C, the dependence of D1 and D2 on Pw are different from each other, although D1 and D2 both approach zero when Pw approaches the setting value Pwo of the recording power.

As n1<n2, if comparing the numbers of pulses when forming marks related with n1 and marks related with n2, the relation holds that m/n1>m/n2. That is, when forming marks related with n2, the pulse number per mark length is smaller, so mark formation is easier when n=n2. On the other hand, when forming marks related with n1, the pulse number per mark length is larger, and mark formation is more difficult than when n=n2. Accordingly, the relation D2<D1 holds. Further, as shown in FIG. 6C, the difference between D1 and D2 is larger when the recording power Pw is lower.

In the recording method of the related art, as shown in FIG. 6B, because the dependence of the deviation D on the recording power Pw is not strong, Pwo is determined from the dependence of the modulation on Pw as shown in FIG. 6A. In the present invention, as the dependence of D1 and D2 on Pw is stronger than that of the modulation, Pwo is determined from the dependence of D1 and D2 on Pw rather than the modulation.

Summarizing the above description, the present invention is characterized by that fact that the recording power Pwo is determined by monitoring the mark length, while a high modulation is obtainable due to recording using a smaller number of light emitting pulses.

In the following, a method for determining the recording power Pwo is explained in detail.

First, test recording is performed to determine the recording power Pwo, in which trial marks are formed on an optical data recording medium. This test recording can be made at any place on the recording medium, but it is preferable to use the test areas other than the user area. For example, use can be made of PCA (Power Calibration Area, an area for test recording) of CD-RW, or PCA of DVD+RW.

In this test recording, the recording speed, that is, the speed of scanning a light beam for irradiation on the medium is set to be an actual speed for recording data. Particularly, in order to fully obtain the effects of the present invention, it is preferable to set the scanning speed to be not lower than 12 m/s, more preferably, not lower than 24 m/s. Specific examples of such a speed include 10 or more times speed compact discs, 5 or more times speed DVD. If the scanning speed is lower than 10 m/s, heating damage to the recording material due to irradiation of the light beam becomes severe, and this tends to degrade the overwrite characteristic of the medium.

For the test recording, any data pattern used in the actual data recording can be used, that is, any modulated data are recorded as a test pattern, for example, a random pattern, a simple increasing pattern, and so on. Concerning modulation schemes and data patterns in the test recording, use can be made of the modulation schemes such as PWM (EFM, EFM+1, one-seven, and so on) mentioned above.

The optical system used for recording and reproducing can be configured according to the recording density and recording speed. For example, use can be made of an optical system for CD having NA 0.50 and λ=780 nm, or an optical system for DVD having NA 0.60 or NA 0.65 and λ=680 nm.

The recording patterns shown in FIGS. 3C through 3E are used, that is, a number of m pulses are used to form marks at least having different lengths of n1·Tw and n2·Tw (assuming n1<n2). The combination of n1 and n2 may be one of those shown in FIG. 4.

A period of the recording channel clock Tw matching the recording speed can be used, and it is desirable to use higher frequencies in order to fully obtain the effect of the present invention. So it is preferable to use Tw less than 24 ns, more preferably, use Tw less than 14 ns. These values are related with the rising time and falling time of light emission of laser diodes installed in commercial recording devices. For example, 20-time speed CD, or 5-time DVD uses such kind of periods of the recording channel clock.

Preferably, the width of the light emitting pulses and the width of the cooling pulses are specified in the range from 0.5 to 2.0 Tw, more preferably, in the range from 0.7 to 1.5 Tw. If the time of light emission is too long, although a high modulation is obtainable, the heat damage to the recording material becomes severe, consequently, the number of times of repeated recording (overwrite) decreases.

The test recording is performed while changing the recording power Pw successively. It is preferable to change the recording power Pw in a broad range not less than ±10% of the predicted setting value Pwo of the recording power, more preferably, not less than ±30% of Pwo. Changing the recording power Pw in a broad range enables improvement of the calculation precision for setting the recording power.

The recording power Pw may be changed continuously or stepwise, the latter one being preferable because it makes the relation between the mark length and the recording power clear when reproducing the test recording marks to measure the mark length. In other words, it is preferable to do the test recording while changing the recording power Pw at intervals of ΔPw. Furthermore, it is preferable to set ΔPw less than 5% of the recording power Pw in order to secure the precision of the recording power setting.

When reproducing the test recording marks, the same optical system as that used for recording is used.

To measure the mark lengths T1 and T2 of the recorded marks, use can be made of the commercial time interval measurement circuits. T1 and T2 are obtained as functions of the recording power Pw. The deviations D1 and D2 of T1 and T2 from their theoretical values are computed from the following formulae.

$$D1 = T1 - n1 \cdot Tw, \text{ and}$$

$$D2 = T2 - n2 \cdot Tw.$$

Because the closer to zero the values of D1 and D2, the better the quality of the reproduced signals, it is preferable to set the value of the recording power Pw making D1 and D2 approximately zero to be the recording power Pwo.

Fluctuations of the medium properties may exist, for example, the fluctuation of the thickness, or the atomic composition of the material in the recording layer 3. In this case, probably a value of Pw making D1 and D2 zero does not exist, even using the light emitting pulses having the same pulse shape. In this case, it is preferable to set the value of the recording power Pw making D1 equal to D2 as the recording power Pwo.

If such a Pw does not exist, either, the setting value Pwo of the recording power can be obtained by evaluating a parameter g normalized by Tw as shown in the following formula:

$$g = (D2 - D1)/Tw,$$

and the setting value of the recording power Pwo is set to a value of Pw that makes the parameter g equal to an object value gα. Here, gα is a constant associated with properties of a medium, and it is preferable that gα be in the range of 0<gα≦0.1. Because g is normalized, it can be used as a common quantity independent of the recording speed and the period of the recording channel clock.

If the value of gα is recorded in a medium beforehand, an optical data recording device may read out the value when necessary, and compute the recording power Pwo based on this value.

Note that when setting the recording power Pwo using gα, D1 does not equal D2 at Pwo. In that case, it is preferable to correct the pulse shape of the light emitting pulses to reduce the difference between D1(Pwo) and D2(Pwo).

Preferably, the above correction can be made by changing the width of the light emitting pulses, for example, by correcting the pulse width $T_{fp}$ as shown in FIG. 3d of the light emitting pulses for writing marks related with n1. Specifically, it is enough to lengthen the $T_{fp}$ by an amount of D2(Pwo)−D1(Pwo). Due to this correction, it is possible to correct the deviations of the mark lengths related with n1 and n2 from their theoretical values.

There are other methods of corrections. For example, the correction can be made by adjusting the pulse width of the last pulse among the light emitting pulses. In detail, the adjustment is made by correcting the pulse width $T_{lp}$ shown in FIG. 3d. Similarly, it is enough to lengthen $T_{lp}$ related to n1 only by an amount of D2(Pwo)−D1(Pwo).

When setting the recording power Pwo using the above parameter g(Pw), the precision of the recording power can be improved by utilizing a region exhibiting stronger dependence of g on the recording power Pw.

In FIG. 6C, it is clear that g(Pw) varies drastically along with the change of the recording power Pw when the recording power Pw is small. Accordingly, it is preferable to use the region where Pw is small to set the recording power Pwo.

In order to set g(Pw) with high precision, preferably, g(Pw) is approximately in a range from 0.4·Tw through 0.6·Tw. So if defining a parameter gβ satisfying 0.4≦gβ≦0.6, the recording power Pwt that makes g(Pwt) =gβ is obtained with high precision. In this case, however, if Pwo is set equal to Pwt, recording will be done in a region leading to a large difference between D2 and D1. So preferably, Pwt is multiplied by a constant ρ, and the recording power Pwo is set to be the product of ρ and Pwt, that is to say, ρ·Pwt.

To make Pwo≧Pwt, ρ should be greater than 1.0, but if ρ is too large, the error of setting Pwt becomes large, for example, if ρ=2, this error is doubled. Therefore, it is preferable to set ρ not greater than 1.2.

Similarly, if values of gβ which is associated with material properties, and ρ are recorded in a medium beforehand, an optical data recording device may read out these values when necessary, and then compute the recording power Pwo based on these values.

Figure 7:
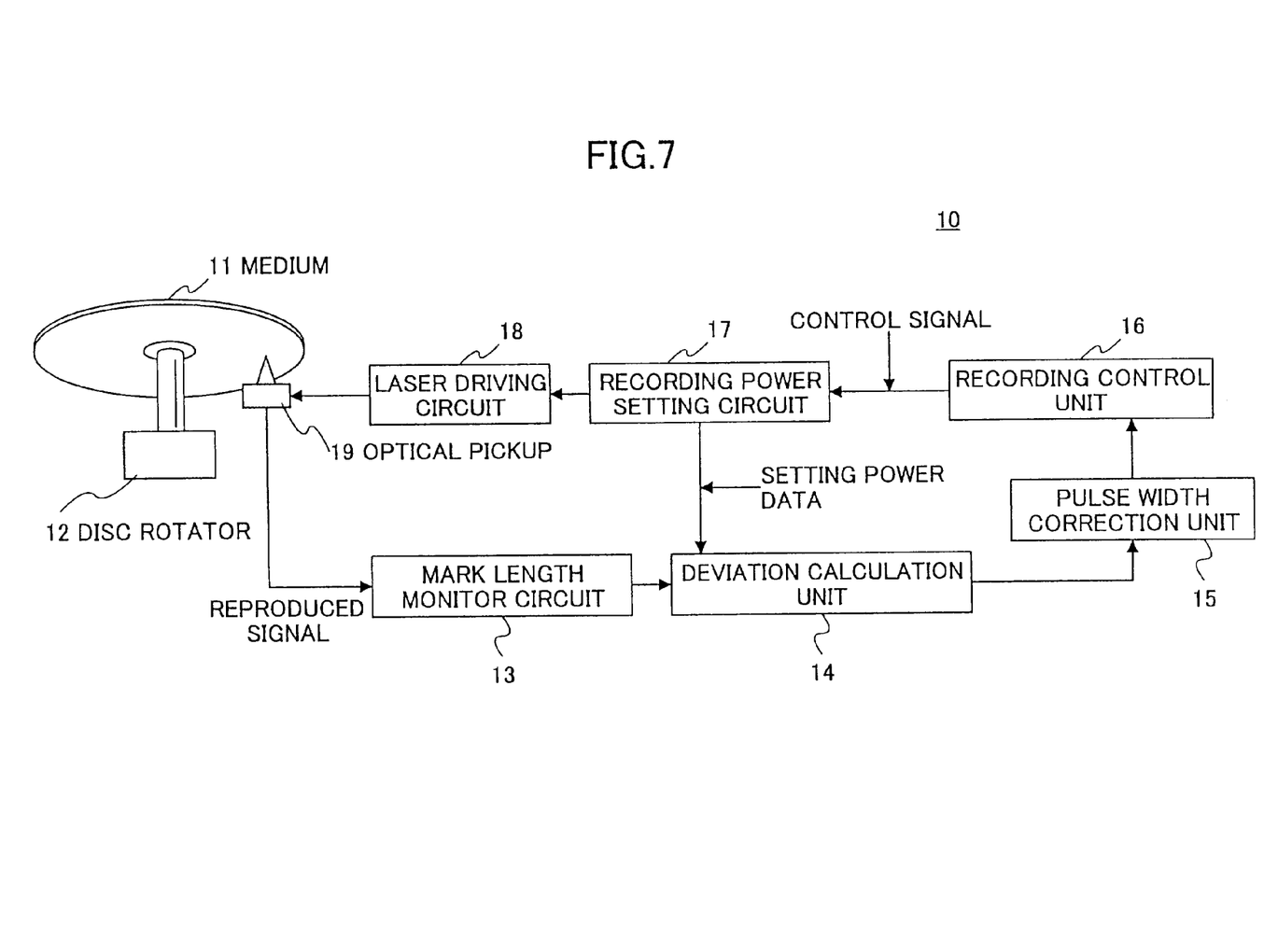
FIG. 7 is a view showing an example of a configuration of an optical data recording device related to the present invention.

FIG. 7 shows an example of a configuration of an optical data recording device 10 related to the present invention using the above recording method. As shown in FIG. 7, the optical data recording device 10 is comprised of a recording medium 11, a disk rotator 12, a mark length monitor circuit 13, a deviation calculation unit 14, a pulse width correction unit 15, a recording control unit 16, a recording power setting circuit 17, a laser driving circuit 18, and an optical pickup 19.

The recording power Pw is set in the recording power setting circuit 17. Also in the recording power setting circuit 17, the recording power Pw set here is changed successively for test recording. Driven by this recording power Pw, the laser driving circuit 18 operates, and controls the optical pickup 19 to emit light pulses at a specified recording power Pwo. At the same time, information of the recording power Pwo set in the recording power setting circuit 17 is fed back to the deviation calculation unit 14.

The optical pickup 19 reproduces the test recording pattern, and supplies the reproduced signals to the mark length monitor circuit 13. There, mark lengths of marks formed in the test recording are measured and the measurement results are input to the deviation calculation unit 14.

The deviation calculation unit 14 calculates the recording power Pw, D1(Pw) and D2(Pw), and sets the recording power Pwo. Furthermore, when it is determined to be necessary to correct the pulse shape of the light emitting pulses, the pulse width correction unit 15 makes corrections to the recording light emitting pulses, and the relevant information is fed back to the recording control unit 16.

Next, the present invention will be explained in detail by presenting embodiments and examples, but the present invention is not limited to these embodiments.

The First Embodiment

In a CD-RW disk, for example, as that shown in FIG. 2, on a polycarbonate substrate 1 transcribed with continuous grooves, a lower protective layer 2, a recording layer 3, an upper protective layer 4, a reflective layer 5, and an overwrite layer 6 are deposited in order, and so a CD-RW disk is fabricated.

The lower protective layer 2 and the upper protective layer 4 are made from a mixture of ZnS and $SiO_2$ (their mole ratio is 8:2). The thickness of the lower protective layer 2 is 80 nm, and that of the upper protective layer 4 is 15 nm. These films are formed by means of RF magnetron sputtering.

The recording layer 3 is formed from a phase-change material of $Ag_1In_3Sb_{77}Te_{19}$ with a small amount of Ge added, and its thickness is 15 nm.

The reflective layer 5 is formed from an alloy of Al with a small amount of Ti added, and its thickness is 150 nm.

The overwrite layer 6 is formed from a commercial ultraviolet curable resin used for optical disks. The film is formed by spin-coating in a nitrogen gas atmosphere and is cured by irradiation of ultraviolet rays.

The fabricated disk is completely crystallized using a commercial device for initializing phase-change disks.

The optical disk obtained in such a way (hereinafter, referred to as sample A) conforms to the specifications of Orange Book Part 3, which is the standard for unrecorded CD-RW.

Experiments were performed to record test patterns onto sample A, and to calculate the recording power Pwo to be set. The recording device 10 includes the well-known DDU1000 device for evaluating recording signals and reproduced signals of CD-R and CD-RW. The specifications of the optical pickup 19 are: NA=0.50, $\lambda$=789 nm, maximum emission power=35 mW.

The recording light emitting pulse shown in FIG. 4 is used, and random information modulated by EFM is recorded as the recording pattern. Because EFM is adopted, the pattern with n=14 is not used. The period of the recording channel clock Tw is set to be 9.64 ns, equivalent to a 24-time speed compact disk.

The light beam is scanned while the disk is rotated at a linear velocity of 28.8 m/s, being equivalent to a 24 times speed compact disk.

The test recording is done while changing the recording power from 28 mW to 35 mW at steps of 1 mW. The recording pattern formed in the test recording is reproduced by the same device, and the mark lengths are measured for each recording power using a time interval analyzer, and the modulation is measured using an oscilloscope.

Figure 8:
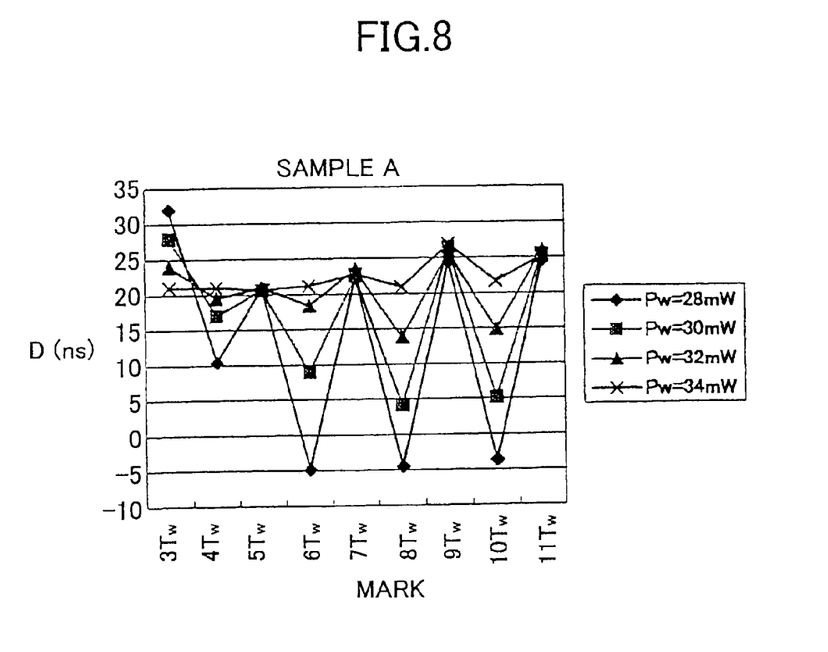
FIG. 8 is a view showing measurement results of deviation D of the mark length of sample A from its theoretical length.

FIG. 8 shows measurement results of deviation D of the measured mark lengths of sample A from their theoretical lengths. In this embodiment, because n1=2 m, and n2=2 m+1, marks having a length equal to Tw multiplied by an even number are short at lower power. Therefore, at 28 mW, the deviations D for both even numbers and odd numbers are large, but at 34 mW, they are substantially the same.

Figure 9:
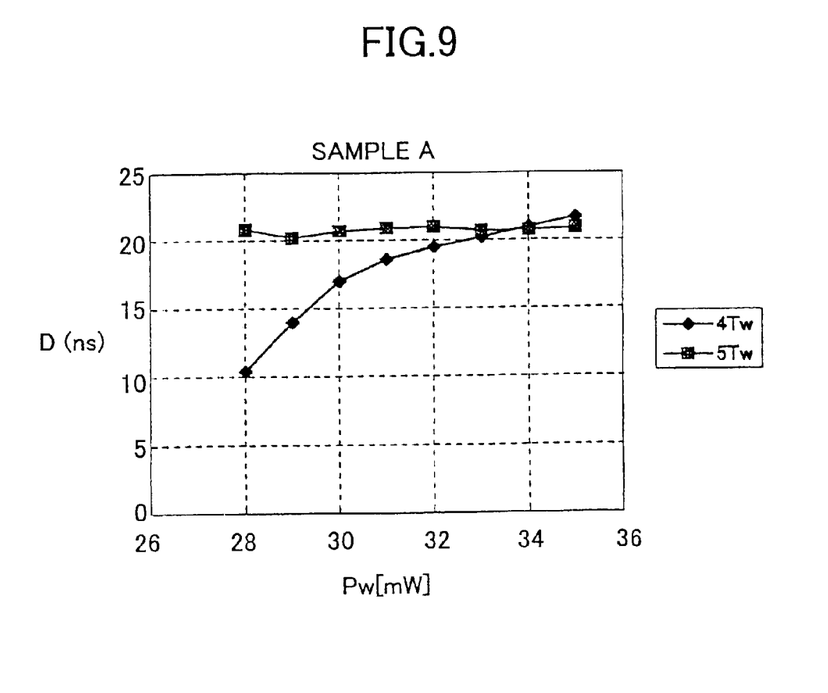
FIG. 9 is a view showing dependence of D1 and D2 on the recording power for sample A when n1=4 and n2=5.

FIG. 9 shows dependence of D1 and D2 on the recording power for sample A when n1=4 and n2=5. As shown in FIG. 9, D1=D2 when the recording power is 34 mW, therefore, when n1=4 and n2=5, by finding the point at which D1=D2, the recording power Pwo is set to 34 mW.

The Second Embodiment

Figure 10:
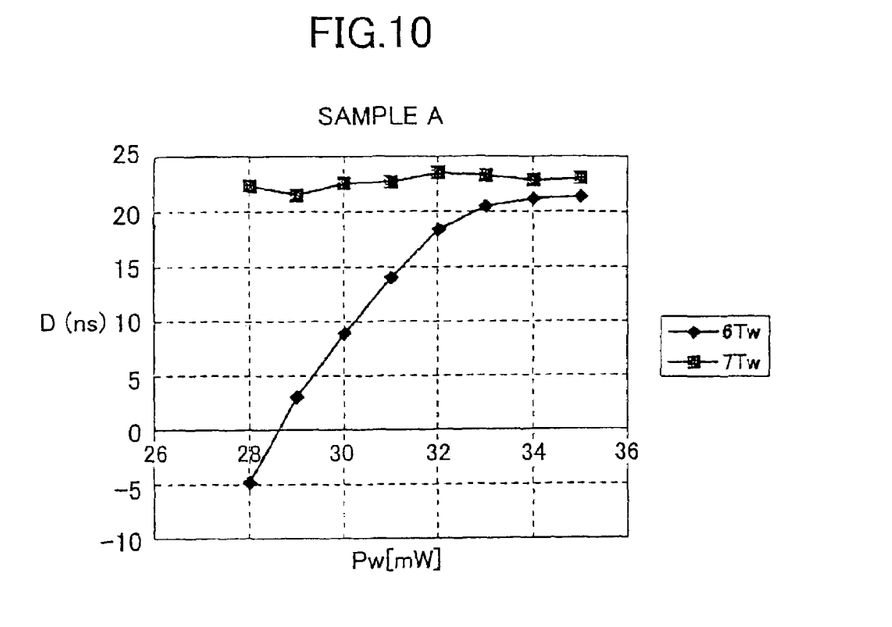
FIG. 10 is a view showing dependence of D1 and D2 on the recording power for sample A when n1=6 and n2=7.

FIG. 10 shows dependence of D1 and D2 on the recording power for sample A when n1=6 and n2=7. As shown in FIG. 10, in this case, because there is not a point where D1=D2, the parameter g is used to find the recording power Pwo.

Figure 11:
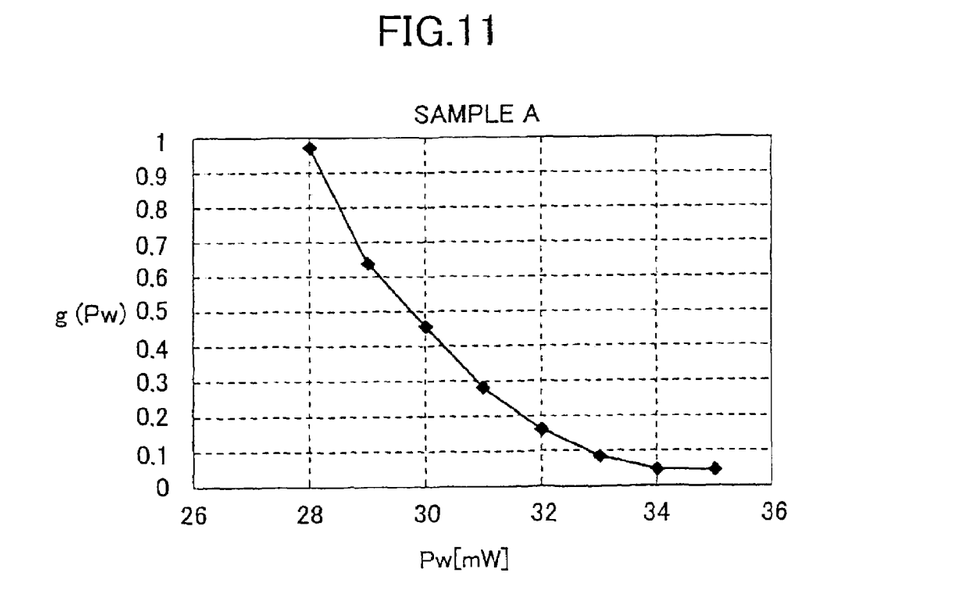
FIG. 11 is a view showing dependence of the parameter g on the recording power for sample A.

FIG. 11 shows dependence of the parameter g on the recording power for sample A. Setting g$\alpha$=0.5, and calculating the point at which g=g$\alpha$, the recording power Pwo is set to 34 mW.

The Third Embodiment

Another optical disk (sample B) was fabricated. Sample B is the same as sample A except that the thickness of the recording layer 3 is 17 nm. The same evaluation as that in the first embodiment was made.

Figure 12:
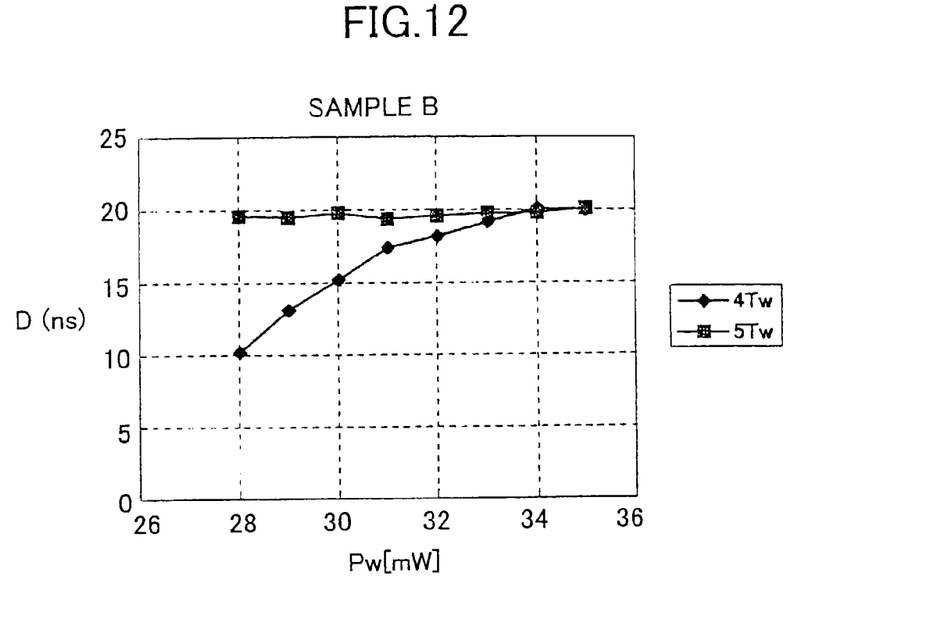
FIG. 12 is a view showing dependence of D1 and D2 on the recording power for sample B when n1=4 and n2=5.

FIG. 12 shows dependence of D1 and D2 on the recording power for sample B when n1=4 and n2=5. As shown in FIG. 12, D1 is approximately equal to D2 when the recording power Pw is 34 mW. Therefore, when n1=4 and n2=5, the recording power Pwo is set to 34 mW.

So, it is found that although the dependences of D1 and D2 on the recording power change due to the change of the thickness of the recording layer 3 in sample A and sample B, the same recording power Pwo is obtained.

The Fourth Embodiment

For sample B, the same evaluation as that in the second embodiment was made.

Figure 13:
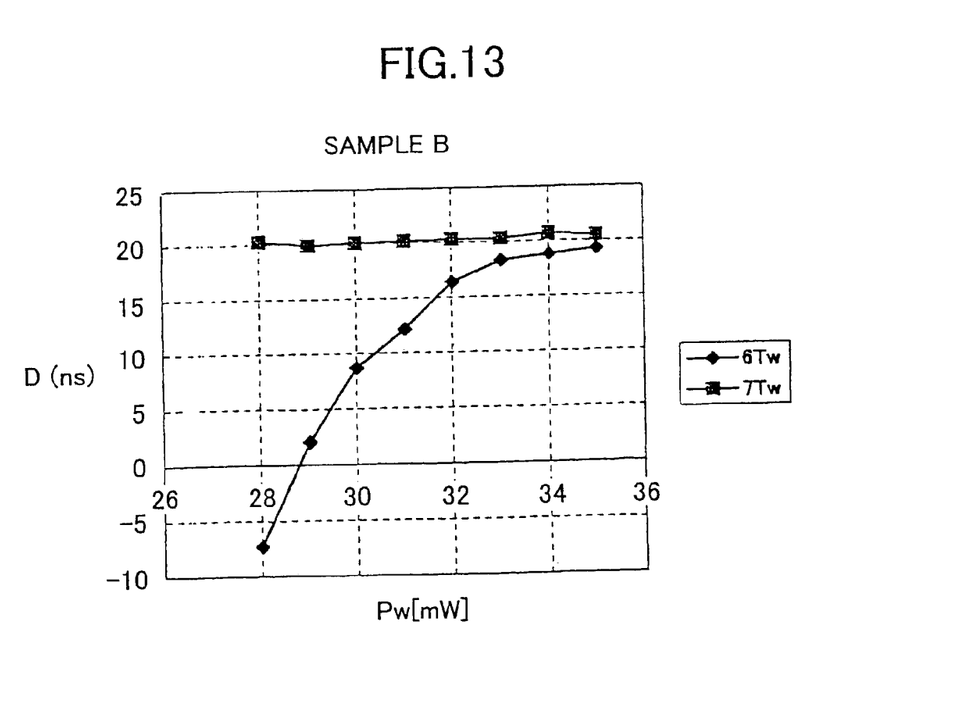
FIG. 13 is a view showing dependence of D1 and D2 on the recording power for sample B when n1=6 and n2=7.

FIG. 13 shows dependence of D1 and D2 on the recording power for sample B when n1=6 and n2=7. Note that although FIG. 13 shows the same behavior of the dependence as FIG. 10, the absolute values are different. The same as with sample A, because there is not a point where D1=D2, the parameter g is used to find the recording power Pwo.

Figure 14:
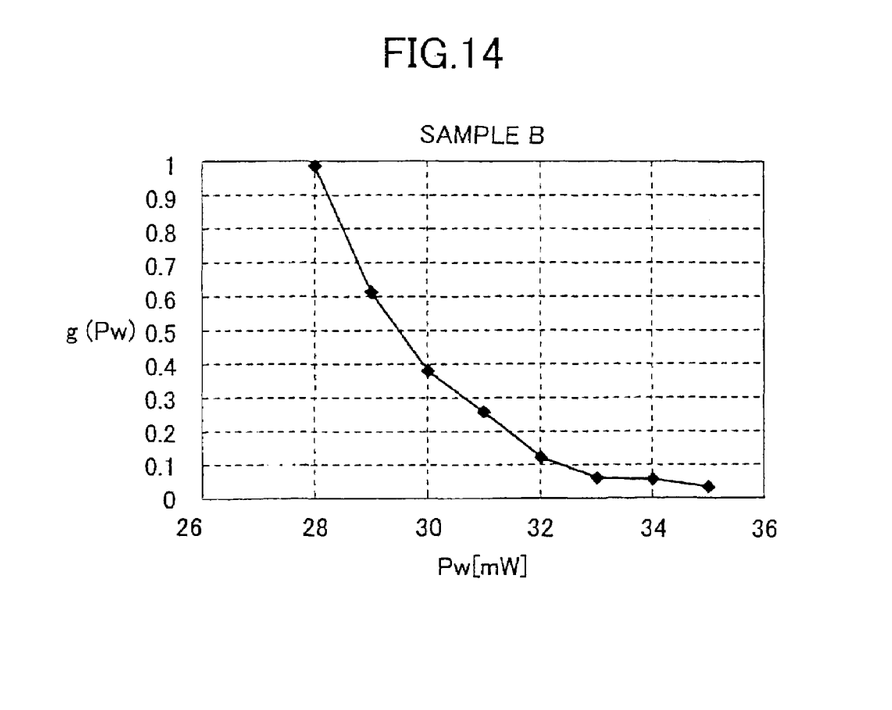
FIG. 14 is a view showing dependence of the parameter g on the recording power for sample B.

FIG. 14 shows dependence of the parameter g on the recording power for sample B. If assuming sample A and sample B have the same solid fluctuation, the recording power Pwo can be calculated using the same parameters. So, the same as the second embodiment, the recording power Pwo is calculated by setting g$\alpha$=0.5, and consequently, the recording power Pwo is set to 34 mW.

EXAMPLE 1

Discussed below is a method of the related art for setting the recording power Pwo, that is, setting the recording power Pwo by evaluating the modulation.

Figure 15:
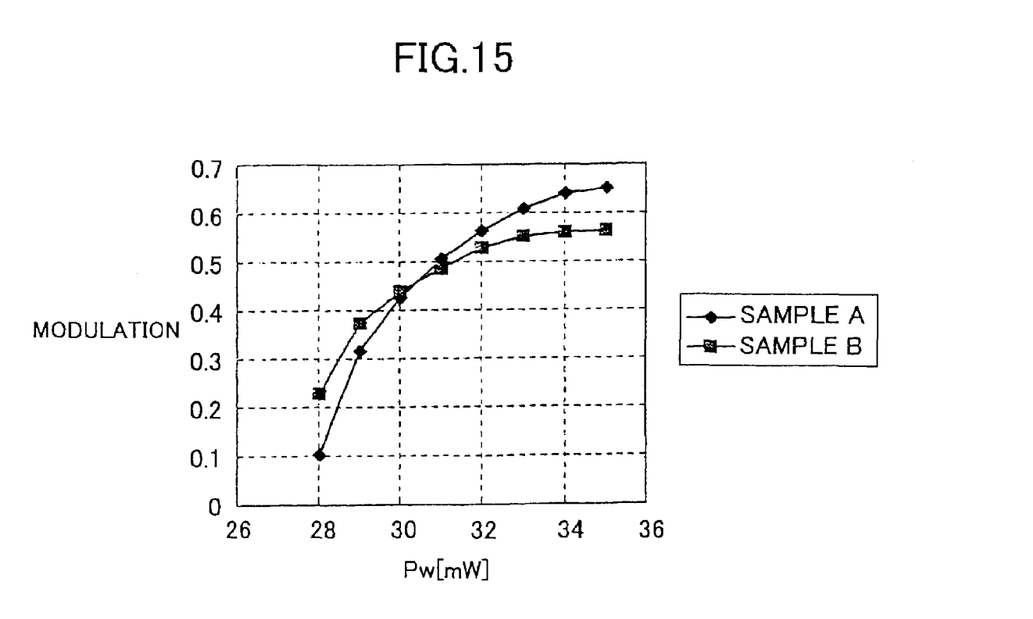
FIG. 15 is a view showing dependence of modulation on the recording power for sample A and sample B.

FIG. 15 shows dependence of the modulation on the recording power for sample A and sample B. As shown in FIG. 15, the modulation curves of sample A and sample B are different from each other, and their relative relation in the lower power region is reversed in the high power region. Therefore, it is difficult to correctly evaluate the recording power Pwo by the same evaluation means.

EXAMPLE 2

For CD-RW, a so-called γ parameter is used for evaluation.

Figure 16:
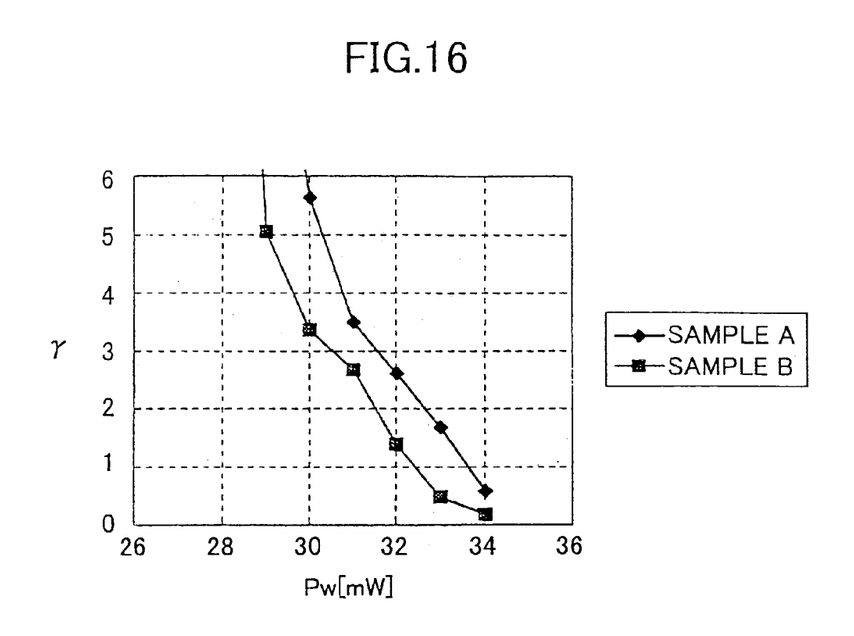
FIG. 16 is a view showing dependence of the γ parameter on the recording power.

FIG. 16 shows dependence of the γ parameter on the recording power for sample A and sample B. As shown in FIG. 16, the γ parameter shows a larger difference between sample A and sample B than the modulation as shown in FIG. 15. Therefore, drawing the same conclusion, it is difficult to correctly evaluate the recording power Pwo by the same parameter.

While the present invention has been described with reference to specific embodiments chosen for purpose of illustration, it should be apparent that the invention is not limited to these embodiments, but numerous modifications could be made thereto by those skilled in the art without departing from the basic concept and scope of the invention.

Summarizing the effect of the invention, according to the present invention as shown above, test recording is performed to correctly evaluate the recording power Pwo to be set. In the test recording, marks having a length of n1·Tw and marks having a length of n2·Tw (n1<n2) are formed both by the same number (m) of light emitting pulses, while the recording power Pw is successively changed. Then these marks are reproduced and the mark lengths T1 and T2 are measured from the reproduced signals, and the deviations D1, D2 between the actual lengths and their theoretical lengths are calculated. By monitoring D1 and D2, the recording power Pwo is determined. As a result, while recording with a small number of pulses is possible, the recording power can be set to a region where the difference of the dependence of the mark length on the recording power is suppressed to the minimum, and this enables recording of data at higher modulations and lower error rate. Furthermore, setting of the recording power can be optimized without being influenced by fluctuations of media properties.

In addition, according to the present invention, since it is possible to set a recording power level that is capable of reducing the deviation between the actual mark lengths and their theoretical lengths to the minimum, setting of the recording power can be optimized even by recording using a small number of pulses.

Further, the present invention provides methods for effectively setting the recording power even when the above conditions cannot be satisfied.

When the condition that D1=D2 cannot be satisfied, by adjusting the pulse width of the light emitting pulses, it is possible to set the recording power while further reducing the difference between D1 and D2.

The present invention further provides an optical data recording device utilizing the above recording method.

This patent application is based on Japanese priority patent application No. 2002-089145 filed on Mar. 27, 2002, the entire contents of which are hereby incorporated by reference.

What is claimed is:

1. A method for recording optical data to a recording medium by modulating the intensity of an irradiating light beam and by modulating the lengths of a plurality of recording marks and spaces between each two said recording marks, comprising the steps of:
    forming first recording marks each having a length of n1·Tw and second recording marks each having a length of n2·Tw using a plurality of m recording pulses each having a predetermined maximum power Pw, while successively changing the maximum power Pw of the recording pulses for testing;
    reproducing the first and second marks recorded for said testing and measuring lengths T1(Pw) and T2(Pw), respectively, of the recording marks; and
    setting a recording power Pwo by evaluating deviations D1(Pw) and D2(Pw) of the measured lengths T1(Pw) and T2(Pw) from n1·Tw and n2·Tw, respectively,
    where Tw is a period of a recording channel clock;
    n1, n2 are integers, and n1<n2;
    m is an integer, and m<n1;
    D1(Pw)=T1(Pw)−n1·Tw; and
    D2(Pw)=T2(Pw)−n2·Tw.

2. The method for recording optical data as claimed in claim 1, wherein the recording power Pwo is set as a value of Pw making the deviation D1(Pw) equal to the deviation D2(Pw).

3. The method for recording optical data as claimed in claim 1, wherein the recording power Pwo is set as a value of Pw making a normalized parameter g(Pw) equal to a constant gα,
    where g(Pw)=[D2(Pw)−D1(Pw)]/Tw;
        gα is a characteristic value of the recording medium, and 0<gα≦0.1.

4. The method for recording optical data as claimed in claim 3, wherein at the recording power Pwo, a first pulse width of the recording pulses for forming the recording marks each having the length of n1·Tw is lengthened by an amount of D2(Pwo)−D1(Pwo).

5. The method for recording optical data as claimed in claim 3, wherein at the recording power Pwo, a last pulse width of the recording pulses for forming the recording marks each having the length of n1·Tw is lengthened by an amount of D2(Pwo)−D1(Pwo).

6. The method for recording optical data as claimed in claim 1, wherein the recording power Pwo is set as a product of a parameter ρ and a value of the maximum power Pwt making a normalized parameter g(Pw) equal to a constant gβ,
    where g(Pw)=(D2(Pw)−D1(Pw))/Tw;
        gβ is a constant, and
        0.4≦gβ≦0.6; and
        ρ is in a range from 1.0 through 1.2.

7. A device for recording optical data to a recording medium by modulating the intensity of an irradiating light beam and by modulating the lengths of a plurality of recording marks and spaces between two said recording marks, comprising:
    an optical pickup unit for forming the recording marks according to a plurality of recording pulses and for reproducing the recorded marks;
    a power control unit for controlling a power level of the recording pulses;
    a mark length measuring unit for measuring the lengths of the recorded marks from the reproduced signals given by the optical pickup unit; and
    a calculation unit,
    wherein the optical pickup unit forms first recording marks for testing each having a length of n1·Tw and second recording marks each having a length of n2·Tw using m recording pulses each having a predetermined maximum power Pw, while the power controlling unit successively changes the maximum power Pw of the recording pulses, the optical pickup unit reproduces the first and the second marks recorded for said testing, the mark length measuring unit measures lengths $T1(Pw)$ and $T2(Pw)$ of the first and second recorded marks, respectively, and the calculation unit evaluates deviations $D1(Pw)$ and $D2(Pw)$ of the measured lengths $T1(Pw)$ and $T2(Pw)$ from $n1 \cdot Tw$ and $n2 \cdot Tw$, respectively, and sets a recording power Pwo, where Tw is a period of a recording channel clock period;
n1, n2 are integers, and n1<n2;
m is an integer, and m<n1;
$D1(Pw)=T1(Pw)-n1 \cdot Tw$; and
$D2(Pw)=T2(Pw)-n2 \cdot Tw$.

8. The device for recording optical data as claimed in claim 7, wherein the calculation unit calculates a normalized parameter g(Pw), where $g(Pw) [D2(Pw)-D1(Pw)]/Tw$.

* * * * *